(12) United States Patent
Brink et al.

(10) Patent No.: US 11,005,022 B2
(45) Date of Patent: May 11, 2021

(54) VERTICAL TRANSMON QUBIT DEVICE WITH MICROSTRIP WAVEGUIDES

(71) Applicant: International Business Machines Corporation, Armonk, NY (US)

(72) Inventors: Markus Brink, White Plains, NY (US); Sami Rosenblatt, White Plains, NY (US); Rasit Onur Topaloglu, Poughkeepsie, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/799,285

(22) Filed: Feb. 24, 2020

(65) Prior Publication Data
US 2020/0194654 A1    Jun. 18, 2020

Related U.S. Application Data

(62) Division of application No. 15/934,348, filed on Mar. 23, 2018, now Pat. No. 10,672,971.

(51) Int. Cl.
*H01L 39/00* (2006.01)
*H01L 39/02* (2006.01)
(Continued)

(52) U.S. Cl.
CPC ............ *H01L 39/025* (2013.01); *B82Y 10/00* (2013.01); *B82Y 40/00* (2013.01); *G06N 10/00* (2019.01);
(Continued)

(58) Field of Classification Search
CPC ..... H01L 39/025; H01L 27/18; H01L 39/223; H01L 39/2493; H01L 23/66; H01L 29/66977; G06N 10/00
See application file for complete search history.

(56) References Cited

U.S. PATENT DOCUMENTS

5,366,953 A    11/1994    Char et al.
5,385,883 A    1/1995    Lenzing et al.
(Continued)

FOREIGN PATENT DOCUMENTS

WO    2017/015432 A1    1/2017
WO    2017/217961 A1    12/2017

OTHER PUBLICATIONS

Non-Final Office Action received for U.S. Appl. No. 16/246,676 dated Mar. 19, 2020, 27 pages.
(Continued)

*Primary Examiner* — Matthew L Reames
(74) *Attorney, Agent, or Firm* — Amin, Turocy & Watson, LLP

(57) ABSTRACT

Techniques for a vertical Josephson junction superconducting device using microstrip waveguides are provided. In one embodiment, a chip surface base device structure is provided that comprises a superconducting material located on a first side of a substrate, and a second superconducting material located on a second side of the substrate and stacked on a second substrate, wherein the first side of the substrate and the second side of the substrate are opposite sides. In one implementation, the substrate or the second substrate, or the substrate and the second substrate are crystalline silicon. In one implementation, the chip surface base device structure also comprises a transmon qubit comprising a capacitor and a Josephson junction formed in a via of the substrate and comprising a tunnel barrier. In one implementation, the chip surface base device structure also comprises a microstrip line electrically coupled to the transmon qubit.

18 Claims, 13 Drawing Sheets

(51) Int. Cl.

| | |
|---|---|
| *H01L 39/22* | (2006.01) |
| *H01L 39/24* | (2006.01) |
| *H01P 3/08* | (2006.01) |
| *H01P 11/00* | (2006.01) |
| *H01L 23/66* | (2006.01) |
| *G06N 10/00* | (2019.01) |
| *B82Y 10/00* | (2011.01) |
| *H01L 27/18* | (2006.01) |
| *B82Y 40/00* | (2011.01) |

(52) U.S. Cl.
CPC .............. *H01L 23/66* (2013.01); *H01L 27/18* (2013.01); *H01L 39/223* (2013.01); *H01L 39/2493* (2013.01); *H01P 3/081* (2013.01); *H01P 11/003* (2013.01); *H01L 2223/6627* (2013.01)

(56) References Cited

U.S. PATENT DOCUMENTS

| | | |
|---|---|---|
| 5,476,719 A | 12/1995 | Sandell et al. |
| 5,523,282 A | 6/1996 | Simon et al. |
| 5,910,662 A | 6/1999 | Itozaki et al. |
| 6,348,699 B1 | 2/2002 | Zehe |
| 6,734,454 B2 | 5/2004 | Van Duzer et al. |
| 6,818,549 B2 | 11/2004 | Fricke et al. |
| 6,823,201 B2 | 11/2004 | Kai et al. |
| 6,979,836 B2 | 12/2005 | Zagoskin et al. |
| 7,888,746 B2 | 2/2011 | Tischler |
| 8,148,715 B2 | 4/2012 | Hollenberg et al. |
| 9,324,767 B1 | 4/2016 | Steinbach et al. |
| 9,397,283 B2 | 7/2016 | Abraham et al. |
| 9,425,377 B2 | 8/2016 | Moyerman et al. |
| 9,455,391 B1 | 9/2016 | Nayfeh et al. |
| 9,501,748 B2 | 11/2016 | Naaman et al. |
| 9,520,547 B2 | 12/2016 | Abraham et al. |
| 9,741,918 B2 | 8/2017 | Yohannes et al. |
| 9,768,371 B2 | 9/2017 | Ladizinsky et al. |
| 10,243,132 B1 | 3/2019 | Rosenblatt et al. |
| 10,256,392 B1 | 4/2019 | Brink et al. |
| 2001/0035524 A1 | 11/2001 | Zehe |
| 2004/0104449 A1 | 6/2004 | Yoon et al. |
| 2005/0123674 A1 | 6/2005 | Stasiak et al. |
| 2008/0032501 A1 | 2/2008 | Klein et al. |
| 2015/0357550 A1 | 12/2015 | Schoelkopf, III et al. |
| 2015/0372217 A1 | 12/2015 | Schoelkopf, III et al. |
| 2016/0104073 A1 | 4/2016 | Sandberg et al. |
| 2017/0133336 A1 | 5/2017 | Oliver et al. |
| 2017/0133576 A1 | 5/2017 | Marcus et al. |
| 2017/0148972 A1 | 5/2017 | Thompson et al. |
| 2017/0179193 A1 | 6/2017 | Tolpygo |
| 2017/0186935 A1 | 6/2017 | Bonetti et al. |
| 2018/0040800 A1 | 2/2018 | Chang et al. |
| 2018/0138389 A1 | 5/2018 | Kirby et al. |
| 2018/0232654 A1 | 8/2018 | Epstein et al. |
| 2018/0287041 A1 | 10/2018 | Abdo |
| 2019/0363239 A1 | 11/2019 | Yoscovits et al. |

OTHER PUBLICATIONS

Braumuller et al., "Concentric transmon qubit featuring fast tunability and an anisotropic magnetic dipole moment," arXiv:1509.08014v3 [quant-ph], Jan. 2016, 10 pages.

Mariantoni et al., "Two-resonator circuit quantum electrodynamics: A superconducting quantum switch," Physical Review B, 78, 2008, 22 pages.

Defeo et al., "Microstrip Superconducting Quantum Interference Devices for Quantum Information Science," Doctoral dissertation, Syracuse University, 2012, 183 pages.

Mantl, "Compound formation by ion beam synthesis and a comparison with alternative methods such as deposition and growth or wafer bonding," Nuclear Instruments and Methods in Physics Research B 106, 1995, 9 pages.

Schoelkopf et al., "Final Report: Materials Limits on Coherence in Charge Qubits," IARPA CSQ project at Yale University, Jun. 2, 2015, 26 pages.

Koch et al., "Charge-insensitive qubit design derived from the Cooper pair box," Physical Review A, 76(4), 2007, 19 pages.

Grimm et al., "A self-aligned nano-fabrication process for vertical NbN—MgO—NbN Josephson junctions," arXiv:1705.05608v1 [cond-mat.mes-hall], May 16, 2017, 5 pages.

Lomatch et al., "Multilayered Josephson junction logic and memory devices," Proceedings of the SPIE—The International Society for Optical Engineering, vol. 2157, Jan. 1994, p. 332-343, 13 pages.

Island et al., "Thickness dependent interlayer transport in vertical MoS2 Josephson junctions," arXiv:1604.06944v2 [cond-mat.mes-hall] Jul. 1, 2016, 18 pages.

Notice of Allowance received for U.S. Appl. No. 15/934,400 dated Oct. 31, 2018, 21 pages.

List of IBM Patents or Applications Treated as Related.

Non-Final Office Action received for U.S. Appl. No. 15/934,348 dated Apr. 22, 2019, 29 pages.

International Search Report and Written Opinion received for PCT Application Serial No. PCT/EP2019/054836 dated Jun. 28, 2019, 17 pages.

International Search Report and Written Opinion received for PCT Application Serial No. PCT/EP2019/054837 dated Jun. 28, 2019, 15 pages.

International Search Report and Written Opinion received for PCT Application Serial No. PCT/EP2019/054839 dated Jun. 28, 2019, 16 pages.

Non-Final Office Action received for U.S. Appl. No. 15/934,348 dated Sep. 9, 2019, 21 pages.

Non-Final Office Action received for U.S. Appl. No. 16/248,141 dated Nov. 29, 2019, 21 pages.

Non-Final Office Action received for U.S. Appl. No. 16/246,676 dated Nov. 18, 2019, 31 pages.

1200

```
┌─────────────────────────────────────────────┐
│ ATTACHING A SUBSTRATE COMPRISING CRYSTALLINE│─── 1202
│ SILICON TO A SUPERCONDUCTING MATERIAL AND A │
│ SECOND SUPERCONDUCTING MATERIAL, THE        │
│ SUPERCONDUCTING MATERIAL AND THE SECOND     │
│ SUPERCONDUCTING MATERIAL BEING ATTACHED TO  │
│ OPPOSITE SIDES OF THE SUBSTRATE, AND A      │
│ SECOND SUBSTRATE COMPRISING CRYSTALLINE     │
│ SILICON ATTACHED TO THE SECOND              │
│ SUPERCONDUCTING MATERIAL                    │
└─────────────────────────────────────────────┘
                      │
                      ▼
┌─────────────────────────────────────────────┐
│ FORMING A TRANSMON QUBIT COMPRISING A       │─── 1204
│ JOSEPHSON JUNCTION WITH AT LEAST ONE        │
│ SUPERCONDUCTING CONTACT ON THE FIRST SIDE   │
│ OF THE SUBSTRATE, AND A SHUNTING CAPACITOR  │
└─────────────────────────────────────────────┘
                      │
                      ▼
┌─────────────────────────────────────────────┐
│ ELECTRICALLY COUPLING A MICROSTRIP LINE TO  │─── 1206
│ THE TRANSMON QUBIT                          │
└─────────────────────────────────────────────┘
```

Fig. 12

VERTICAL TRANSMON QUBIT DEVICE WITH MICROSTRIP WAVEGUIDES

BACKGROUND

The subject disclosure relates to superconducting devices, and more specifically, to fabricating a vertical transmon qubit device with microstrip waveguides using a silicon-on-metal (SOM) substrate.

Quantum computing is generally the use of quantum-mechanical phenomena for the purpose of performing computing and information processing functions. Quantum computing can be viewed in contrast to classical computing, which generally operates on binary values with transistors. That is, while classical computers can operate on bit values that are either 0 or 1, quantum computers operate on quantum bits that comprise superpositions of both 0 and 1, can entangle multiple quantum bits, and use interference.

Quantum computing hardware can be different from classical computing hardware. In particular, superconducting quantum circuits generally rely on Josephson junctions, which can be fabricated in a semiconductor device. A Josephson junction generally manifests the Josephson effect of a supercurrent, where current can flow indefinitely across a Josephson junction without an applied voltage. A Josephson junction can be created by weakly coupling two superconductors (sometimes called a superconducting material; a material that conducts electricity without resistance), for example, by a tunnel barrier as described below.

One way in which a Josephson junction can be used in quantum computing is by using the Josephson junction to form a qubit. A Josephson junction can be used to form a qubit by arranging the Josephson junction in parallel with a shunting capacitor. This arrangement of a Josephson junction in parallel with a shunting capacitor is sometimes referred to as a transmon (which is a shortened version of the phrase transmission line shunted plasma oscillation qubit) in the special case where the shunting capacitor has a large capacitance such that the typical ratio of the Josephson energy to the charging energy in the qubit is larger than 10. It is generally understood by those skilled in the art that smaller ratios of the Josephson and the charging energies may not be called a transmon, but for the purposes of this invention, a transmon may designate any arrangement of a Josephson junction in parallel with a shunting capacitor.

A transmon generally has a reduced sensitivity to charge noise compared to some other types of qubits. A mechanism by which a transmon can reduce sensitivity to charge noise by increasing a ratio of Josephson energy to charging energy.

A problem with some prior art transmon qubits is that they occupy a relatively large amount of space. Specifically, a planar capacitor used in some transmon qubits occupies a large area. The compactness of such transmon qubits is limited by both surface and dielectric loss.

Then, there are also problems with some types of prior art Josephson junctions, as applied to producing transmons from these Josephson junctions. A type of Josephson junction with both low loss and low critical current can be made from shadow evaporated aluminum, aluminum oxide, and aluminum (Al—AlOx-Al). However, a problem with such a Josephson junction is that, once the Josephson junction is formed, the resulting device is subject to low-temperature and process constraints.

Additionally, a transmon qubit that utilizes a vertical Josephson junction generally must be designed differently in order to couple to other microwave resonators and/or circuits. Encapsulating superconducting qubit components in the prior art is generally avoided because of a loss associated with deposited dielectrics.

For a vertical transmon qubit on SOM, while a coplanar waveguide can work for circuits on a bottom superconductor layer, this approach may not work on the top superconductor layer, because the bottom metal layer is too close to this top layer in a SOM substrate. Thus, in other transmon qubits, only one level of metal is used for defining resonators on, and in particular, the bottom metal layer is used for defining coupling circuitry.

Additionally, in other approaches for transmon qubits, to form a circuit or to create a resonator, the buried metal needs to be accessed by etching down to the buried metal of the SOM.

SUMMARY

The following presents a summary to provide a basic understanding of one or more embodiments of the invention. This summary is not intended to identify key or critical elements, or delineate any scope of the particular embodiments or any scope of the claims. Its sole purpose is to present concepts in a simplified form as a prelude to the more detailed description that is presented later. In one or more embodiments described herein, devices, systems, chip surface base device structures, computer-implemented methods, apparatus and/or computer program products that facilitate vertical transmon qubit devices are described.

According to an embodiment, a chip surface base device structure is provided. In one example, the chip surface base device structure comprises a superconducting material located on a first side of a substrate; and a second superconducting material located on a second side of the substrate and stacked on a second substrate, wherein the first side of the substrate and the second side of the substrate are opposite sides. In one or more implementations, the chip surface base device structure can further comprise a transmon qubit comprising: a capacitor; and a Josephson junction formed in a via of the substrate and comprising a tunnel barrier. In one or more implementations, the chip surface base device structure can further comprise a microstrip line formed by a portion of the superconducting material and electrically coupled to the transmon qubit.

Such a transmon qubit can have an advantage of providing easier options for electrical coupling, and more options for electrical coupling. In particular, this advantage can be manifested in an ability to capacitively (or electrically) couple such a vertical transmon to top-layer microstrip lines.

In some examples, the microstrip line comprises a communication line that communicatively couples the transmon qubit with another device. Such a transmon qubit can have an advantage of providing easier options for electrical coupling, and more options for electrical coupling. For instance, this advantage can be manifested in an ability to capacitively couple such a vertical transmon to top-layer microstrip lines.

In another embodiment, a method is provided. In one example, the method comprises attaching a superconducting material to a first side of a substrate comprising crystalline silicon. The method can further comprise attaching a second superconducting material to a second side of the substrate, the first side and the second side being opposing sides, wherein the second superconducting material is attached to a second substrate comprising crystalline silicon. The method can further comprise forming a Josephson junction with at least one superconducting contact on the first side of the substrate; forming a transmon qubit from the Josephson junction and a capacitor; and electrically coupling a microstrip line to the transmon qubit. Such a transmon qubit can have an advantage of providing easier options for electrical coupling, and more options for electrical coupling. In particular, this advantage can be manifested in an ability to capacitively couple such a vertical transmon to top-layer microstrip lines.

In some examples of the method, the microstrip line is electrically coupled to one or more transmon qubits, and the microstrip line comprises a portion of the superconducting material. Such a transmon qubit can have an advantage of providing easier options for electrical coupling, and more options for electrical coupling. For instance, this advantage can be manifested in an ability to capacitively couple such a vertical transmon to top-layer microstrip lines.

In another embodiment, a chip surface base device structure is provided. In one example, the chip surface base device structure comprises a crystalline silicon substrate attached to a superconducting material and a second superconducting material, the superconducting material and the second superconducting material being attached to opposing sides of the crystalline silicon substrate, and a second crystalline substrate attached to the second superconducting material. In one or more implementations, the chip surface base device structure can further comprise a transmon qubit comprising a Josephson junction having a tunnel barrier, wherein the Josephson junction is located in a via of the crystalline silicon substrate. In one or more implementations, the chip surface base device structure can further comprise a microstrip line electrically coupled to the transmon qubit. Such a transmon qubit can have an advantage of providing easier options for electrical coupling, and more options for electrical coupling. In particular, this advantage can be manifested in an ability to capacitively couple such a vertical transmon to top-layer microstrip lines.

In some examples, the microstrip line is electrically coupled to one or more transmon qubits, and the microstrip line comprises a portion of the superconducting material. Such a transmon qubit can have an advantage of providing easier options for electrical coupling, and more options for electrical coupling. For instance, this advantage can be manifested in an ability to capacitively couple such a vertical transmon to top-layer microstrip lines.

In another embodiment, a method is provided. In one example, the method comprises attaching a substrate comprising crystalline silicon to a superconducting material and a second superconducting material, the superconducting material and the second superconducting material being attached to opposing sides of the substrate, and a second substrate comprising crystalline silicon attached to the second superconducting material. The method can further comprise forming a transmon qubit comprising a Josephson junction with at least one superconducting contact on the first side of the substrate. The method can further comprise electrically coupling a microstrip line to the transmon qubit. Such a transmon qubit can have an advantage of providing easier options for electrical coupling, and more options for electrical coupling. In particular, this advantage can be manifested in an ability to capacitively couple such a vertical transmon to top-layer microstrip lines.

In another embodiment, a chip surface base device structure is provided. In one example, the chip surface base device structure comprises a silicon-on-metal (SOM) base. In one or more implementations, the chip surface base device structure can further comprise a transmon qubit comprising a Josephson junction formed in a via of the SOM base. In one or more implementations, the chip surface base device structure can further comprise a superconducting material coupled to the SOM base. In one or more implementations, the chip surface base device structure can further comprise a microstrip line electrically coupled to the transmon qubit. Such a transmon qubit can have an advantage of providing easier options for electrical coupling, and more options for electrical coupling. In particular, this advantage can be manifested in an ability to capacitively couple such a vertical transmon to top-layer microstrip lines.

DESCRIPTION OF THE DRAWINGS

FIG. 12 illustrates a flow diagram of an example, non-limiting computer-implemented method that facilitates implementing a vertical transmon qubit device with microstrip waveguides on a SOM substrate in accordance with one or more embodiments described herein.

DETAILED DESCRIPTION

The following detailed description is merely illustrative and is not intended to limit embodiments and/or application or uses of embodiments. Furthermore, there is no intention to be bound by any expressed or implied information presented in the preceding Background or Summary sections, or in the Detailed Description section.

One or more embodiments are now described with reference to the drawings, wherein like referenced numerals are used to refer to like elements throughout. In the following description, for purposes of explanation, numerous specific details are set forth in order to provide a more thorough understanding of the one or more embodiments. It is evident, however, in various cases, that the one or more embodiments can be practiced without these specific details.

Given the above problems with defining electrical coupling circuitry for prior art transmon qubits, the present disclosure can be implemented to produce a solution to one or more of these problems in the form of a vertical transmon qubit device with microstrip waveguides on a SOM substrate. As used herein, some embodiments that describe transmon qubit devices (or Josephson junctions) can refer to vertical transmon qubit devices (or vertical Josephson junctions). Such a transmon qubit can have an advantage of providing easier options for electrical coupling, and more options for electrical coupling. In particular, this advantage can be manifested in an ability to capacitively couple such a vertical transmon to top-layer microstrip lines. A similar approach (and advantage) can be found with regard to planar transmons.

An advantage of such a transmon qubit is that it allows for a bottom ground plane that sets references to transmon qubits and microstrip lines. This advantage extends to an ability to set the bottom ground plane to a zero potential (i.e., ground potential) through moat connections. Additionally, an advantage of such a transmon qubit is an ability to isolate the circuitry on chip edges with moats for improved signal integrity.

Figure 1:
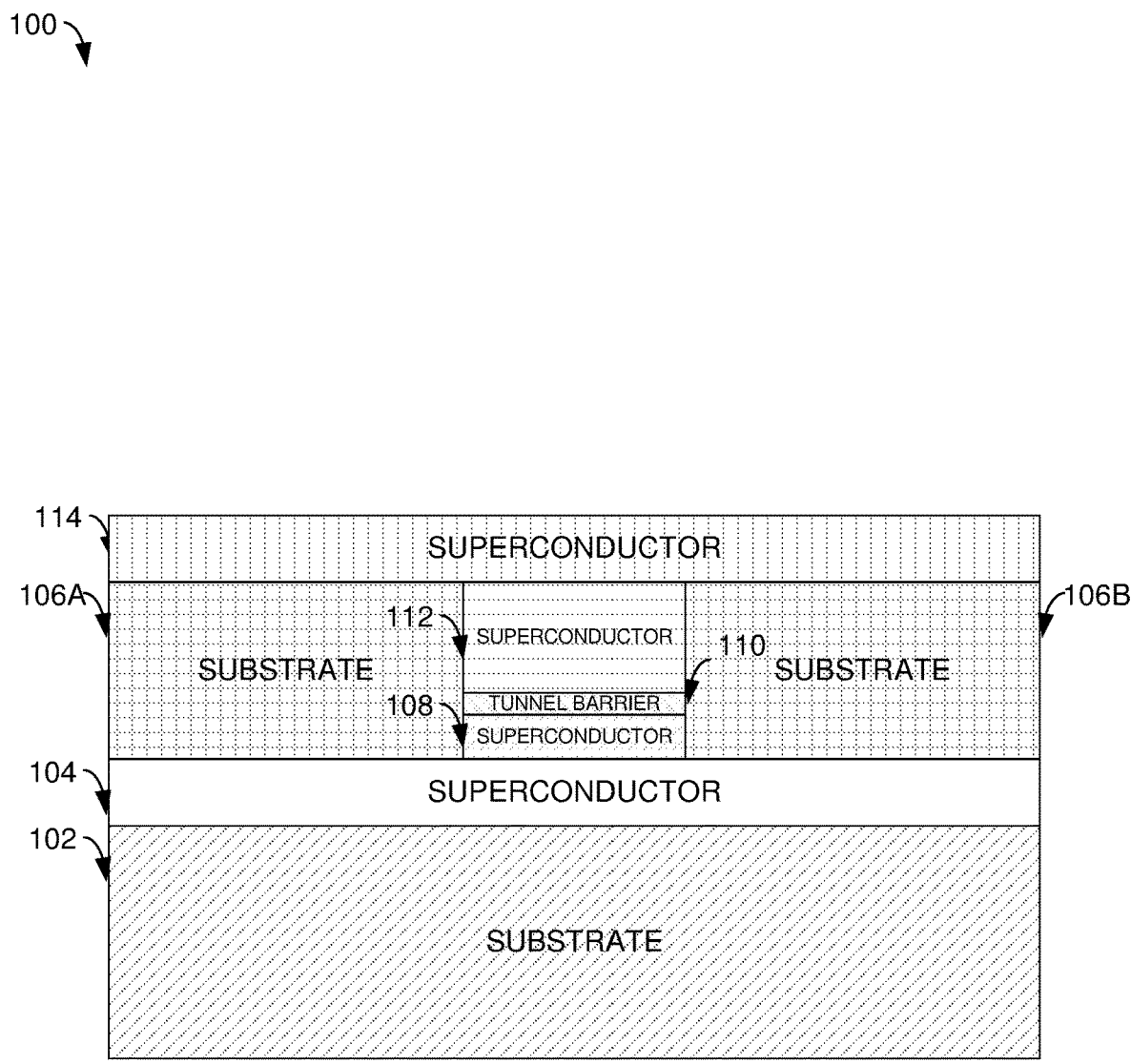
FIG. 1 illustrates an example, non-limiting chip surface base device structure comprising a vertical Josephson junction in accordance with one or more embodiments described herein.

FIG. 1 illustrates an example, non-limiting chip surface base device structure comprising a vertical Josephson junction in accordance with one or more embodiments described herein. Chip surface base device structure 100 comprises substrate 102, superconductor 104, substrate 106A, substrate 106B, superconductor 108, tunnel barrier 110, superconductor 112, and superconductor 114.

In this arrangement of chip surface base device structure 100, superconductor 114 can be considered to be located on a first side of substrate 106A and substrate 106B. Then, superconductor 104 can be considered to be located on a second side of substrate 106A and substrate 106B. The first side of substrate and 106A and substrate 106B, and the second side of substrate 106A and substrate 106B can be considered to be opposite sides of substrate 106A and substrate 106B.

In some examples, substrate 102 can have initial thicknesses of approximately 500 micrometers (μm) to 800 μm. Then, in some examples, the various materials used can be used in temperatures up to approximately 500 degrees Celsius (C). In some examples, materials with lower melting points, such as aluminum (Al) can be used, and these materials can begin to deform at approximately 300 C.

It can be appreciated that some like components of chip surface base device structure 100 touch each other—e.g., superconductor 104 and superconductor 108 are touching, and superconductor 112 and superconductor 114 are touching. It can be appreciated that this is a logical depiction. In some embodiments, these superconductors that are touching can be the same material, and can be deposited in a one step. In other embodiments, these superconductors that are touching can be different (or still the same) materials, which were deposited in separate steps.

The vertical Josephson junction of chip surface base device structure 100 comprises tunnel barrier 110, with superconductor 108 (and optionally in combination with superconductor 104) serving as a first electrode of the vertical Josephson junction, and superconductor 112 (and optionally in combination with superconductor 114) serving as a second electrode of the vertical Josephson junction. In some examples, a thickness of the superconductor(s) of the first electrode and a thickness of the superconductor(s) of the second electrode are approximately the same. This thickness can be greater than 100 nm.

In examples where a same superconducting material is used for both the first electrode and for the second electrode, the superconducting gap on each side of the tunnel barrier can be equal, which may be utilized in determining a critical current (the critical current generally identifying a maximum supercurrent that can flow across the Josephson junction). A value for a critical current in a vertical Josephson junction can be based on materials used, and surface areas of those materials in the junction. Creating multiple vertical Josephson junctions where the associated critical current is more reproducible between those vertical Josephson junctions can be based on material type(s) used, thickness of those materials, and a size of an opening of the vertical Josephson junction.

Another metric associated with a vertical Josephson junction can be a thickness of a material in a vertical Josephson junction where a magnetic field does not penetrate. Where Aluminum (Al) is used as a material in a layer, such a thickness of that material may be 100-200 nm. Tungsten (W) can be another material used, and which has different properties than Al as applied to the penetration of magnetic fields.

The vertical Josephson junction can be formed in a via of a substrate layer, which comprises substrate 106A and substrate 106B, and can originally have contained substrate where superconductor 108, tunnel barrier 110, and superconductor 112 are located. This via can be created through etching into the substrate. In some examples, etch lithography can be implemented to etch the via, with a depth of the via of 100-200 nm. In some examples, an aspect ratio of 1:1 between a height and a width of a via can be effectuated. In some examples, superconductor 108 can be omitted, such that tunnel barrier 110 is in direct contact with superconductor 104.

It can be appreciated that chip surface base device structure 100 presents one of several embodiments of a vertical Josephson junction that can be utilized in a vertical transmon qubit, according to the techniques of the present disclosure. For example, there can be an embodiment of a vertical Josephson junction that omits superconductor 108, so that tunnel barrier 110 is in contact with superconductor 104. For example, there can also be an embodiment of a vertical Josephson junction that omits superconductor 112 (with superconductor 108 being correspondingly thicker), where tunnel barrier sits at a "top" of the via—a placement in the via at an opposite end from superconductor 104.

In some examples, tunnel barrier 110 can be deposited on chip surface base device structure 100 using a sputter approach, an evaporative approach, an atomic layer deposition (ALD) approach, or growth or chemical modification (for example, oxidation) of the superconductor 104 or 108.

In some examples, tunnel barrier 110 can be aluminum oxide ($Al_2O_3$), a non-superconducting metal (sometimes referred to as a "normal" metal), an oxide or a nitride. In some examples, the tunnel barrier 110 can be formed by oxidation of the exposed surface (after etch) of superconductor 104 or superconductor 108. Generally, a tunnel barrier layer can be a thin layer of non-conducting material.

Chip surface base device structure 100 can be considered to be the result of a buried metal flow. Then, the top substrate layer—comprising substrate 106A and substrate 106B—can be ground to a thickness of approximately 100-200 nm, either before or after substrate 106, superconductor 104, and substrate 102 are attached together. In some examples, superconductor 104, as well as other superconductors as described herein, can be titanium (Ti), tantalum (Ta), or titanium nitride (TiN).

In some examples, one or more superconductors described herein can be niobium (Nb) or aluminum (Al). Considerations about the properties of certain materials, and their placement in a chip surface base device structure, such as an amount of thermal treatment involved at a layer of the chip surface base device structure, can affect choice of materials.

The cross-sectional side view of chip surface base device structure 100 shows that substrate 106A and substrate 106B are separated. However, it can be appreciated that a hole has been formed in this substrate layer, which is shown in this cross-sectional side view, and that substrate 106A and substrate 106B are still connected (e.g., from above, this substrate could look as if a hole was formed in the middle of it). Other materials in cross-sectional side views can be similarly attached though they appear to be separated in the cross-sectional side view.

In some examples, one or both of substrate 102 and substrate 106 can be crystalline silicon (Si). The use of crystalline Si can improve a coherence time of a qubit associated with a vertical Josephson junction as described herein. Additionally, in some examples, a high-resistivity crystalline Si can be utilized, which can further improve coherence time of the qubit. In some examples, this crystalline Si can be grown.

In some examples, a portion of superconductor 104 is deposited onto substrate 102, and a portion of superconductor 104 is deposited onto substrate 106. Then, these two portions of superconductor 104 can be bonded together to connect substrate 102 to superconductor 104 to substrate 106. Put another way, after depositing the respective portions of superconductor 104 on substrate 102 and substrate 106, respectively, the exposed surface of the first portion of superconductor 104 can then bonded to the exposed surface of the second portion of superconductor 104. In some examples, bonding can be effectuated with a low-temperature anneal, or another adhesion approach.

In some examples, these various superconductors—i.e., superconductor 104, superconductor 108, superconductor 112, and superconductor 114—can comprise different types of materials from each other. In other examples, two or more of these various superconductors can be the same type of material. In an embodiment, superconductor 104 can be Ti, superconductor 108 can be Ta, and superconductor 112 can be Ta (the same as superconductor 108), and superconductor 114 can be TiN. In some examples, the superconductor 112 is deposited with a greater thickness than superconductor 104 and/or superconductor 108, and this increased thickness can facilitate a better control of removing part or all of superconductor 108 layer at a later time.

Figure 2:
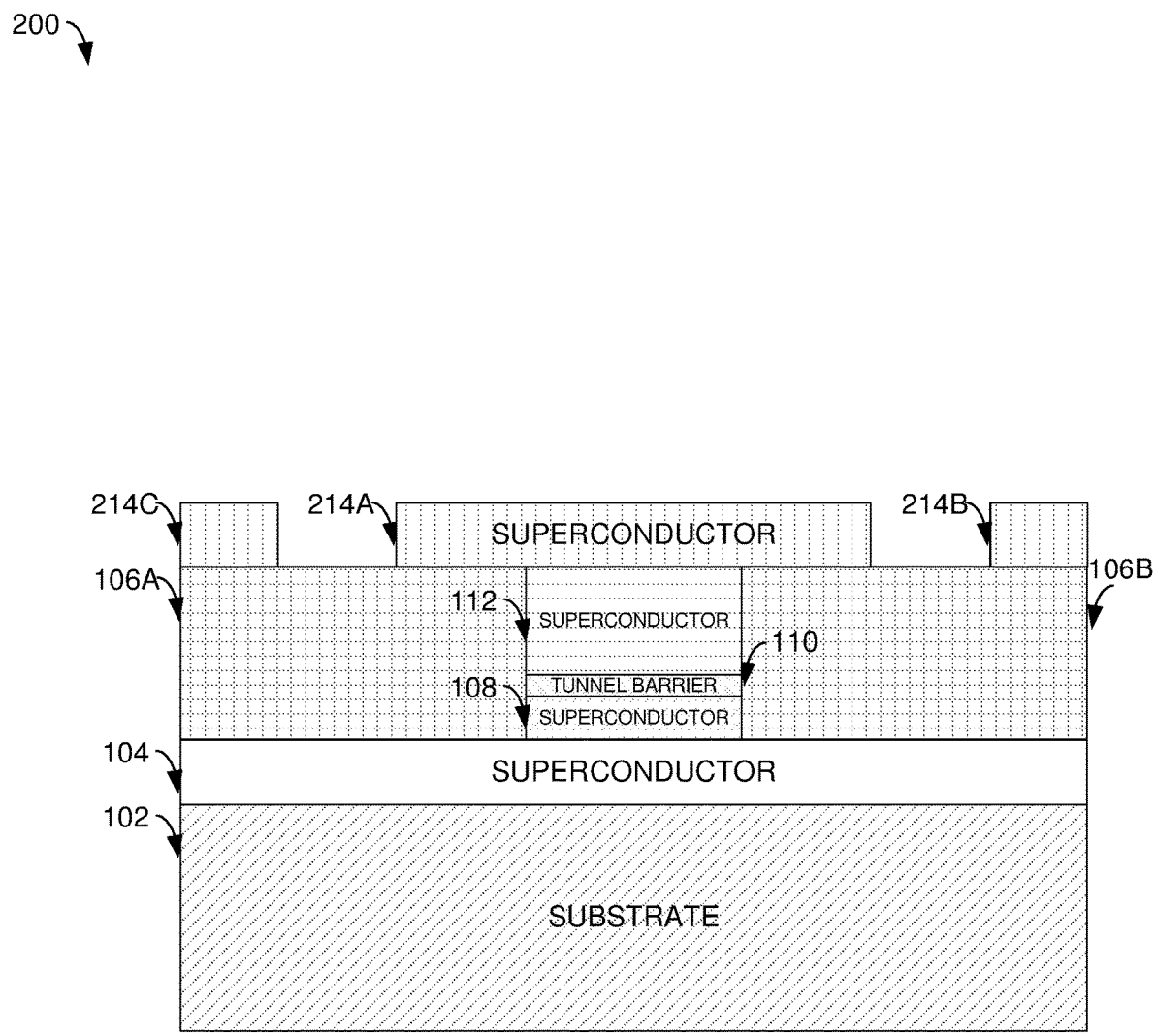
FIG. 2 illustrates the example, non-limiting chip surface base device structure of FIG. 1 after removing some material to form a transmon qubit with top-plane microstrip waveguides in accordance with one or more embodiments described herein.

FIG. 2 illustrates the example, non-limiting chip surface base device structure of FIG. 1 after removing some material to form a transmon qubit with top-plane microstrip waveguides in accordance with one or more embodiments described herein.

In FIG. 2, some of superconductor 114 has been removed to produce superconductor 214A, superconductor 214B, and superconductor 214C. To effectuate removing material, as depicted in FIG. 2, and elsewhere, etching (such as etch lithography) can be used. In some examples, chip surface base device structure 200 is created from chip surface base device structure 100 using a mask and reactive ion etch (RIE) approach. In some examples, superconductor 214A can serve as a superconducting contact on a side of a Josephson junction.

In an example, superconductor 214A can have a width of approximately 7.5 microns (μm); superconductor 112, tunnel barrier 110, and superconductor 108 can have a width of approximately 100 nanometers (nm); and a space between superconductor 214A and superconductor 214B, and between superconductor 214B and superconductor 214C can be a distance of approximately 10 μm. The Josephson junction that comprises superconductor 108, tunnel barrier 110, and superconductor 112 can have a height of 100-200 nm. Additionally, substrate 106A and substrate 106B can have a thickness of 50-300 nm, or 20-500 nm, with a corresponding Josephson junction width.

In this example, chip surface base device structure 200 contains a grounded qubit (i.e., connected to a ground potential) because superconductor 104 connects to the transmon, as well as to the rest of the chip surface base device structure. That is, superconductor 104 functions as a ground plane. Utilizing the bottom ground plane in such a manner can have an advantage of obtaining electrical isolation from crosstalk. Then, superconductor 214B and superconductor 214C function as top circuit waveguides, or microstrip lines.

These dimensions and metrics present an advantage relative to typical transmons, because the transmon here is smaller. In contrast to this smaller transmon, a typical transmon can have a lateral size of 700 μm, which is nearly two orders of magnitude larger than the lateral size of the transmon here.

An advantage of having two layers of superconducting material (as opposed to implementations with one layer of superconducting material) is that this second layer of superconducting material can become an option for communicating with an associated qubit.

Figure 3:
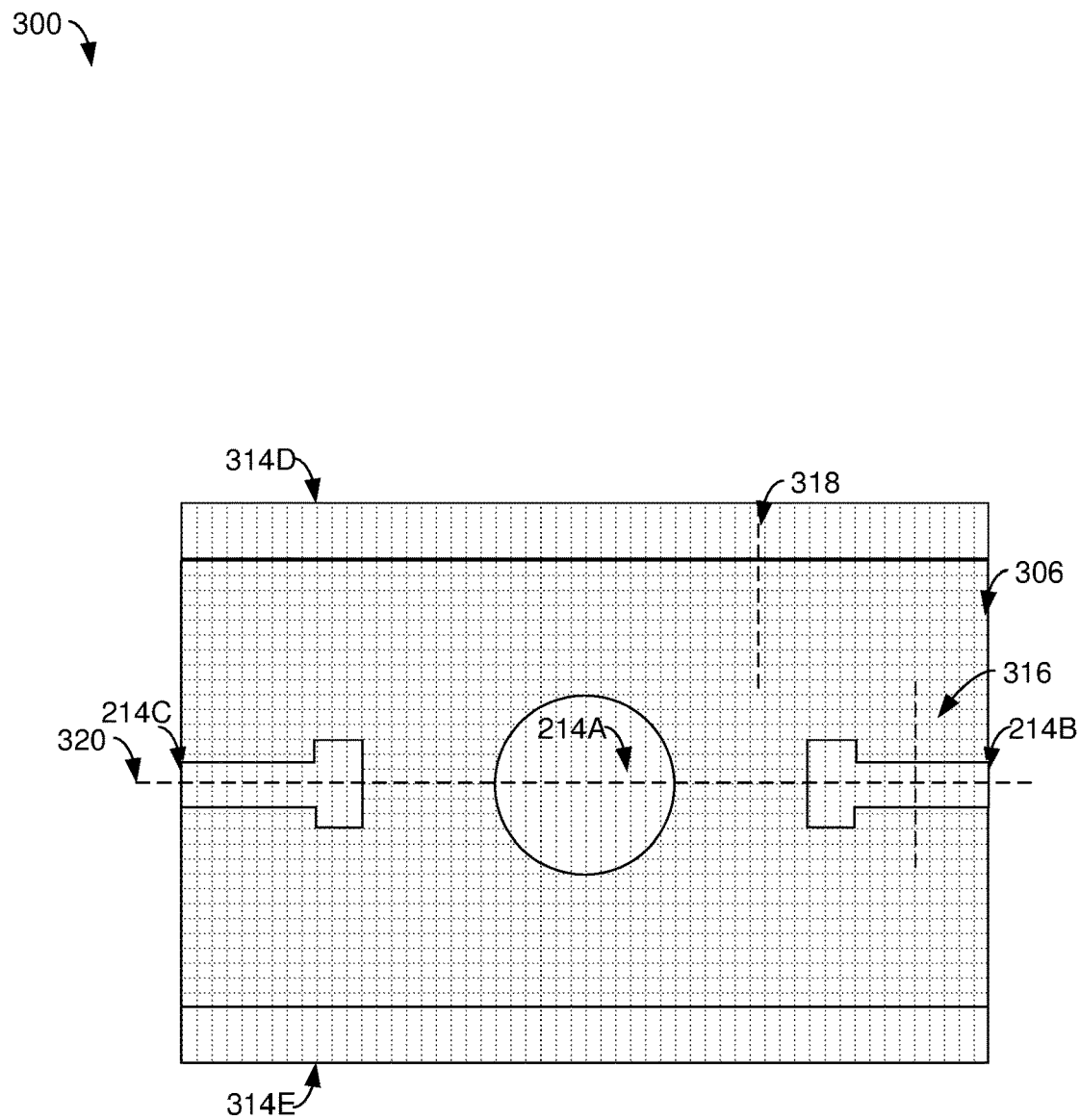
FIG. 3 illustrates a top-down view of the example, non-limiting chip surface base device structure of FIG. 2 in accordance with one or more embodiments described herein.

FIG. 3 illustrates a top-down view of the example, non-limiting chip surface base device structure of FIG. 2 in accordance with one or more embodiments described herein. Substrate 306 comprises substrate 106A and substrate 106B. Whereas chip surface base device structure 200 illustrates a side view of a chip surface base device structure, chip surface base device structure 300 illustrates a corresponding top view of this chip surface base device structure. Chip surface base device structure 300 features circular capacitor pad shapes. With chip surface base device structure 300, the vertical transmon qubit is formed into a circular shape, and it can be appreciated that the vertical transmon qubit can be formed into other shapes, such as a square shape, a rectangular shape or an elliptical (oval) shape. In chip surface base device structure 300, multiple qubits can be connected through the same circuit.

Substrate 306 comprises a combination of substrate 106A and substrate 106B. While, from a cross-sectional side view (represented by dashed line 320), substrate 106A and substrate 106B appear to be separate, that is because they are separated by the transmon qubit in that particular cross-section. Elsewhere, substrate 106A and substrate 106B are connected, and that connection is reflected as substrate 306 in chip surface base device structure 300. Superconductor 214B and superconductor 214C comprise microstrip waveguides for chip surface base device structure 300.

Superconductor 314D and superconductor 314E serve as an electrical ground for chip surface base device structure 300, and have a ground potential.

Chip surface base device structure 300 is marked with three dashed-lines that represent other cross-sectional views of chip surface base device structure 300. In addition to dashed line 320, these two dashed lines—dashed line 316 and dashed line 318—correspond to cross-sectional areas that are depicted in FIGS. 4 and 5, respectively.

Figure 4:
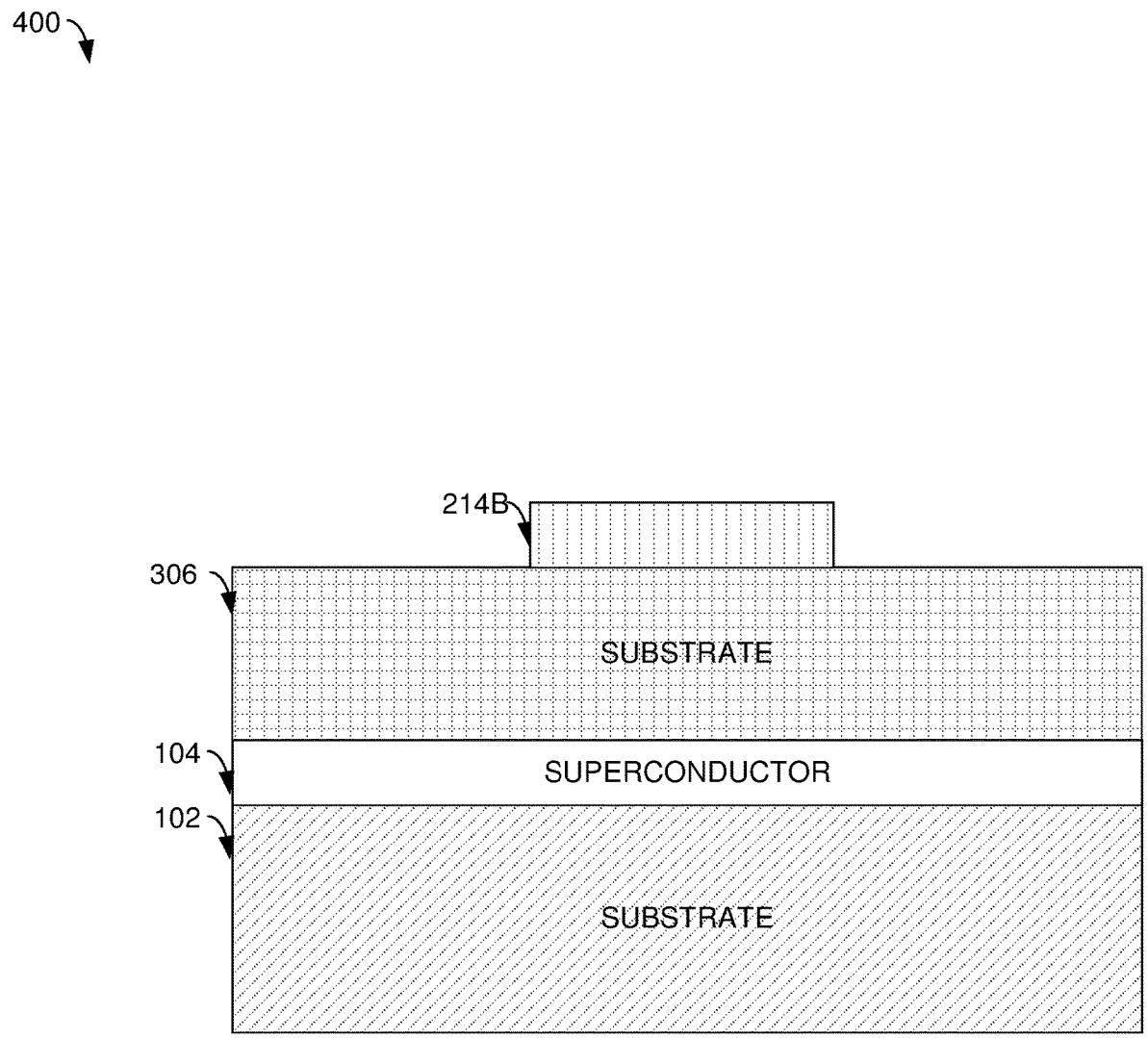
FIG. 4 illustrates a cross-sectional view of a portion of the example, non-limiting chip surface base device structure of FIG. 3 in accordance with one or more embodiments described herein.

FIG. 4 illustrates a cross-sectional view of a portion of the example, non-limiting chip surface base device structure of FIG. 3 in accordance with one or more embodiments described herein. Chip surface base device structure 400 represents a cross-sectional view of chip surface base device structure 300 at the point of dashed line 316. In chip surface base device structure 400, superconductor 104 has a ground potential. A distance between superconductor 104 and superconductor 214B can be approximately 100 nm (i.e., a height of substrate 306 can be approximately 100 nm).

Figure 5:
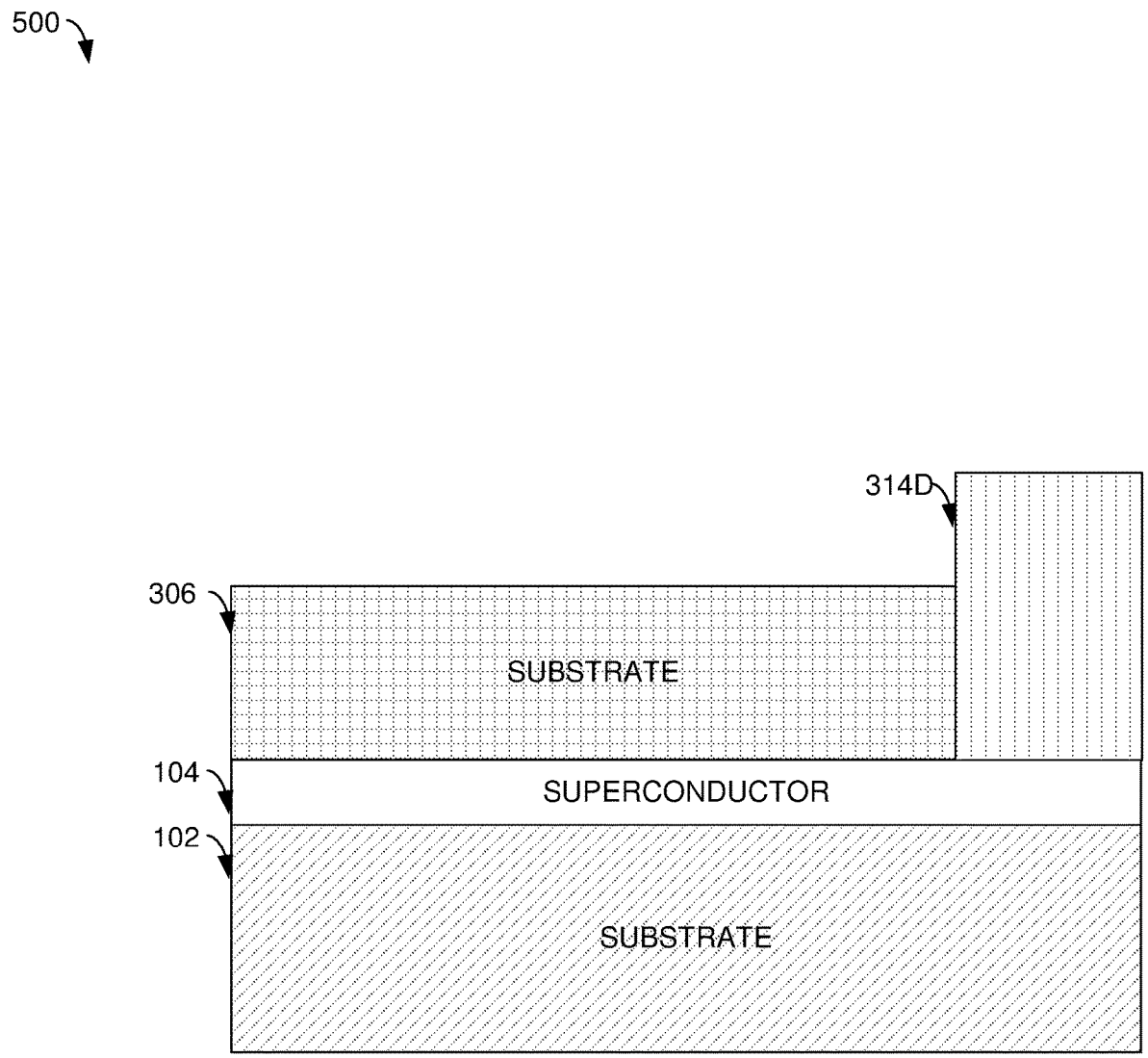
FIG. 5 illustrates another cross-sectional view of a portion of the example, non-limiting chip surface base device structure of FIG. 3 in accordance with one or more embodiments described herein.

FIG. 5 illustrates another cross-sectional view of a portion of the example, non-limiting chip surface base device structure of FIG. 3 in accordance with one or more embodiments described herein. Chip surface base device structure 500 represents a cross-sectional view of chip surface base device structure 300 at the point of dashed line 318. A height of substrate 306 can be approximately 100 nm, with a height of superconductor 314D being taller than the height of substrate 306, so taller than 100 nm here.

As can be seen in chip surface base device structure 500, superconductor 104 (sometimes referred to as a buried ground) and superconductor 314D are electrically connected and therefore at the same electrical potential, while superconductor 314D is accessible from a "top" of chip surface base device structure 500. Connecting to a buried ground from the top of the chip in such a manner can have an advantage of avoiding additional fabrication steps to get an electrical connection to the buried ground from the top of the chip.

Figure 6:
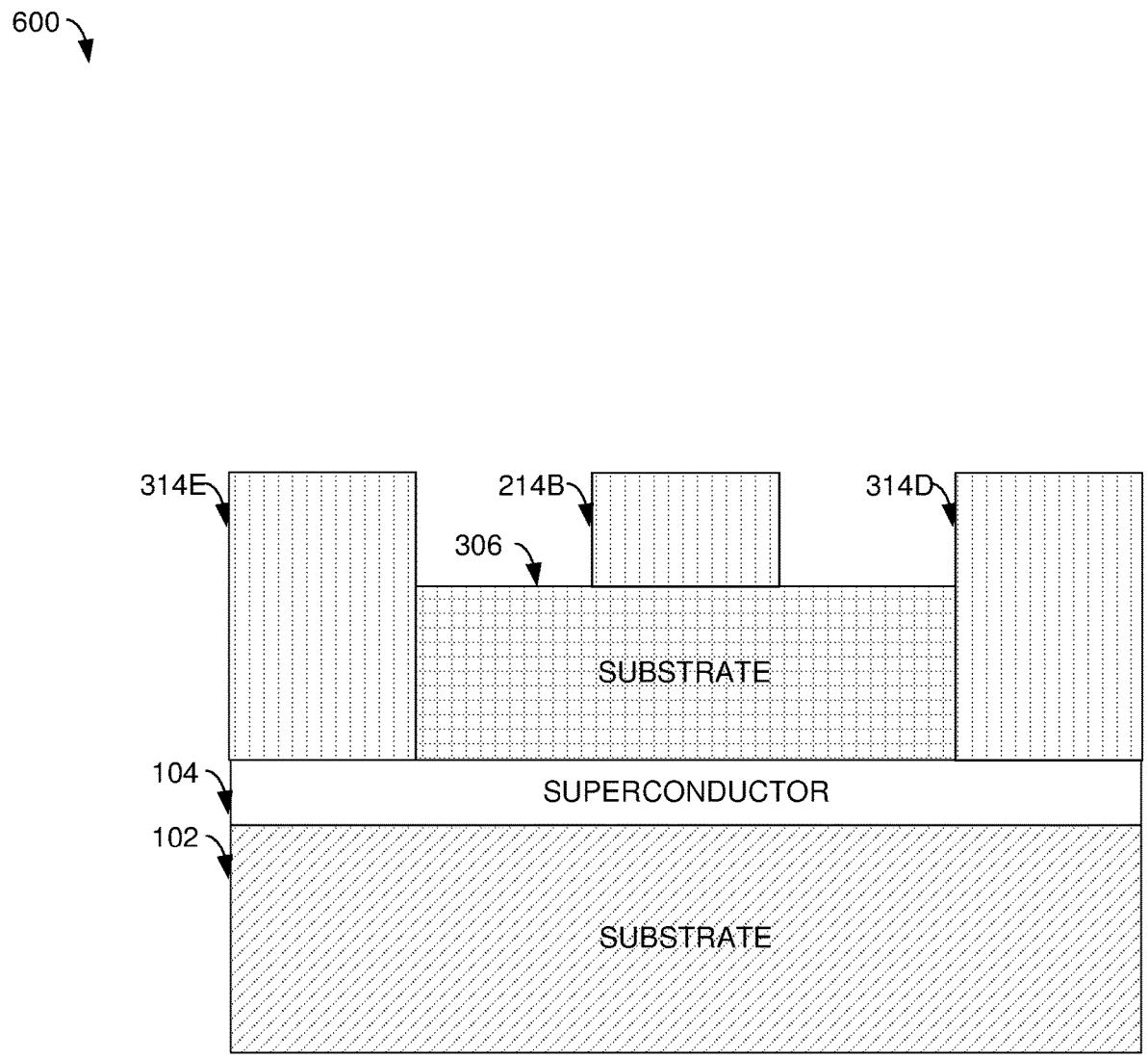
FIG. 6 illustrates another cross-sectional view of a portion of the example, non-limiting chip surface base device structure of FIG. 3 in accordance with one or more embodiments described herein.

FIG. 6 illustrates another cross-sectional view of a portion of the example, non-limiting chip surface base device structure of FIG. 3 in accordance with one or more embodiments described herein. Chip surface base device structure 600 represents a cross-sectional view of chip surface base device structure 300 at the point of dashed line 316, were dashed line to extend further in both directions, so that dashed line 316 covered the full length of chip surface base device structure 300.

In chip surface base device structure a height of substrate 306 is approximately 100 nm. Then, a distance between superconductor 214B and superconductor 314D, and a distance between superconductor 214B and superconductor 314E is much greater than this height of substrate 306, such as 10-100 micrometers.

This approach can have an advantage of providing different ways to make circuits, because the transmon qubit can be accessed in different ways. For example, in different embodiments, rather than accessing the transmon qubit of chip surface base device structure 600 from superconductor 104 (which can be referred to as a bottom layer), the transmon qubit can also be accessed from superconductor 214A (which can be referred to as a top layer), via a top-layer microstrip such as formed by superconductor 214B or superconductor 214C.

Figure 7:
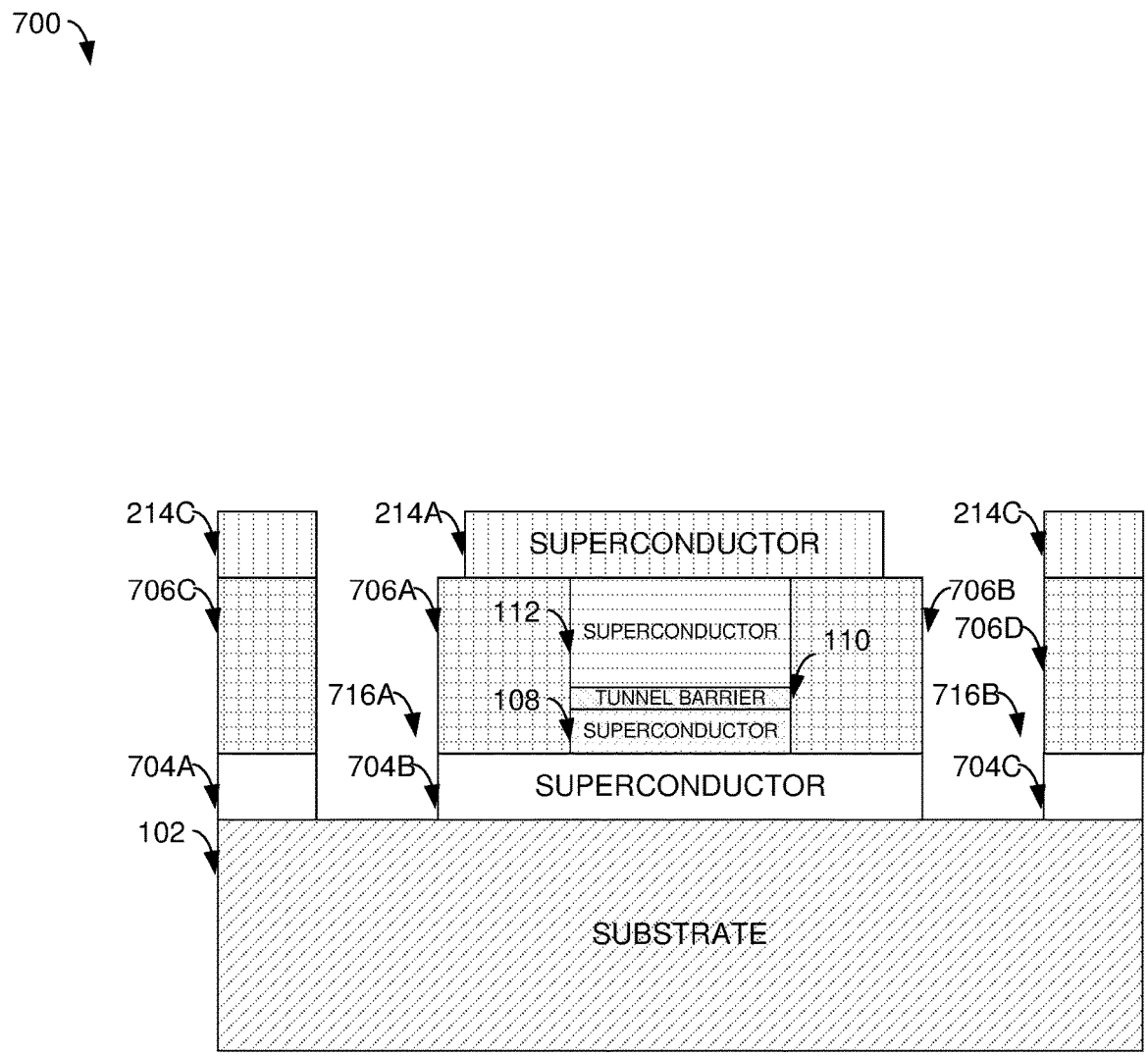
FIG. 7 illustrates the example, non-limiting chip surface base device structure of FIG. 1 after removing some material to form a transmon qubit with top-plane microstrip waveguides in accordance with one or more embodiments described herein.

FIG. 7 illustrates the example, non-limiting chip surface base device structure of FIG. 1 after removing some material to form a transmon qubit with top-plane microstrip waveguides in accordance with one or more embodiments described herein. In contrast to chip surface base device structure 200 where etching is performed to remove portions of a top superconductor layer, here, similar etching is performed, though the etching is deeper, and portions of both the top substrate layer and the superconductor layer beneath it are also removed.

Relative to chip surface base device structure 100, portions of both substrate 106A and substrate 106B are removed, producing substrate 706A and substrate 706C, and substrate 706B and substrate 706D, respectively. Additionally, portions of superconductor 104 are removed, producing superconductor 704A, superconductor 704B, and superconductor 704C.

Those portions of superconductor 104 that have been removed can be referred to as defined gaps between superconductor 704A, superconductor 704B, and superconductor 704C. As depicted, defined gap 716A is a defined gap between superconductor 704A and superconductor 704B, and defined gap 716B is a defined gap between superconductor 704B and superconductor 704C.

This arrangement in chip surface base device structure 700 can be said to result in a floating qubit, because of its electrical isolation. Then, in some embodiments, the top plane (comprising superconductor 214A, superconductor 214B, and superconductor 214C) can be patterned differently via an etch than a pattern of the bottom plane (comprising superconductor 704A, superconductor 704B, and superconductor 704C). This different pattern can be because an etch into the bottom plane defines a bottom capacitor of the transmon qubit, and so a different pattern can be applied to cause this bottom capacitor to have different characteristics.

Figure 8:
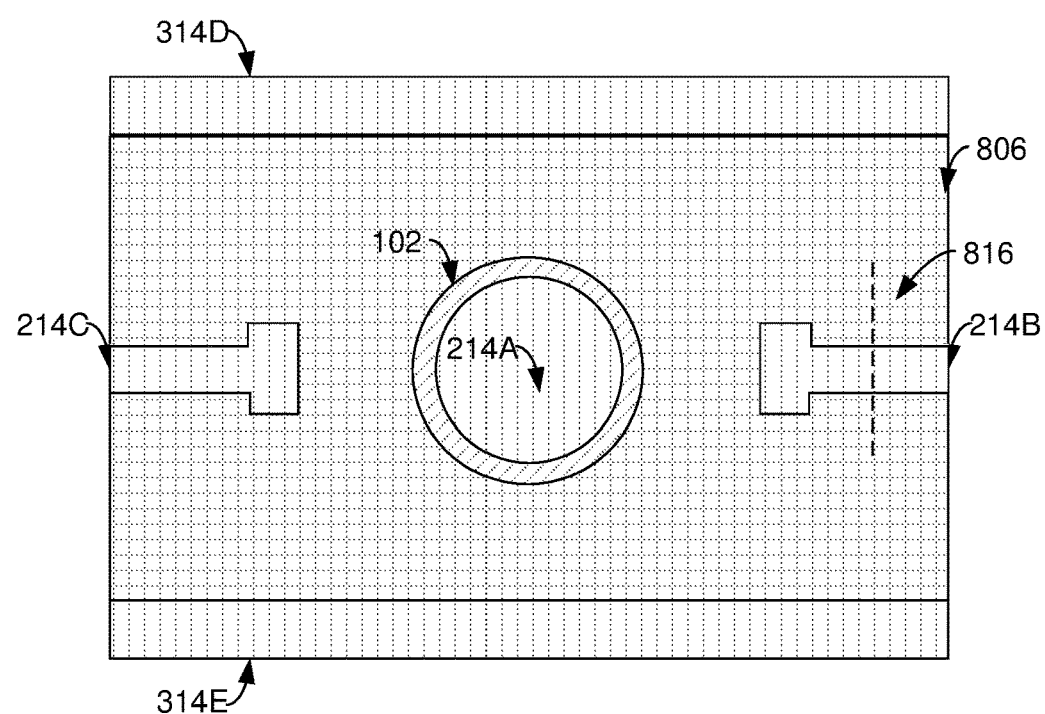
FIG. 8 illustrates a top-down view of the example, non-limiting chip surface base device structure of FIG. 7 in accordance with one or more embodiments described herein.

FIG. 8 illustrates a top-down view of the example, non-limiting chip surface base device structure of FIG. 7 in accordance with one or more embodiments described herein. A difference between chip surface base device structure 800 and chip surface base device structure 200 is that, in chip surface base device structure 800, some of the bottom substrate layer—substrate 102—is visible, and this corresponds to the material removed to produce chip surface base device structure 700.

With chip surface base device structure 800, the vertical transmon qubit is formed into a circular shape, and it can be appreciated that the vertical transmon qubit can be formed into other shapes, such as a square shape, a rectangular shape or an elliptical (oval) shape. In chip surface base device structure 800, multiple qubits can be connected through the same circuit.

Chip surface base device structure 800 is marked with a dashed-line that represents another cross-sectional views of chip surface base device structure 800. This dashed line— dashed line 816—corresponds to the cross-sectional area that is depicted in FIG. 9.

Figure 9:
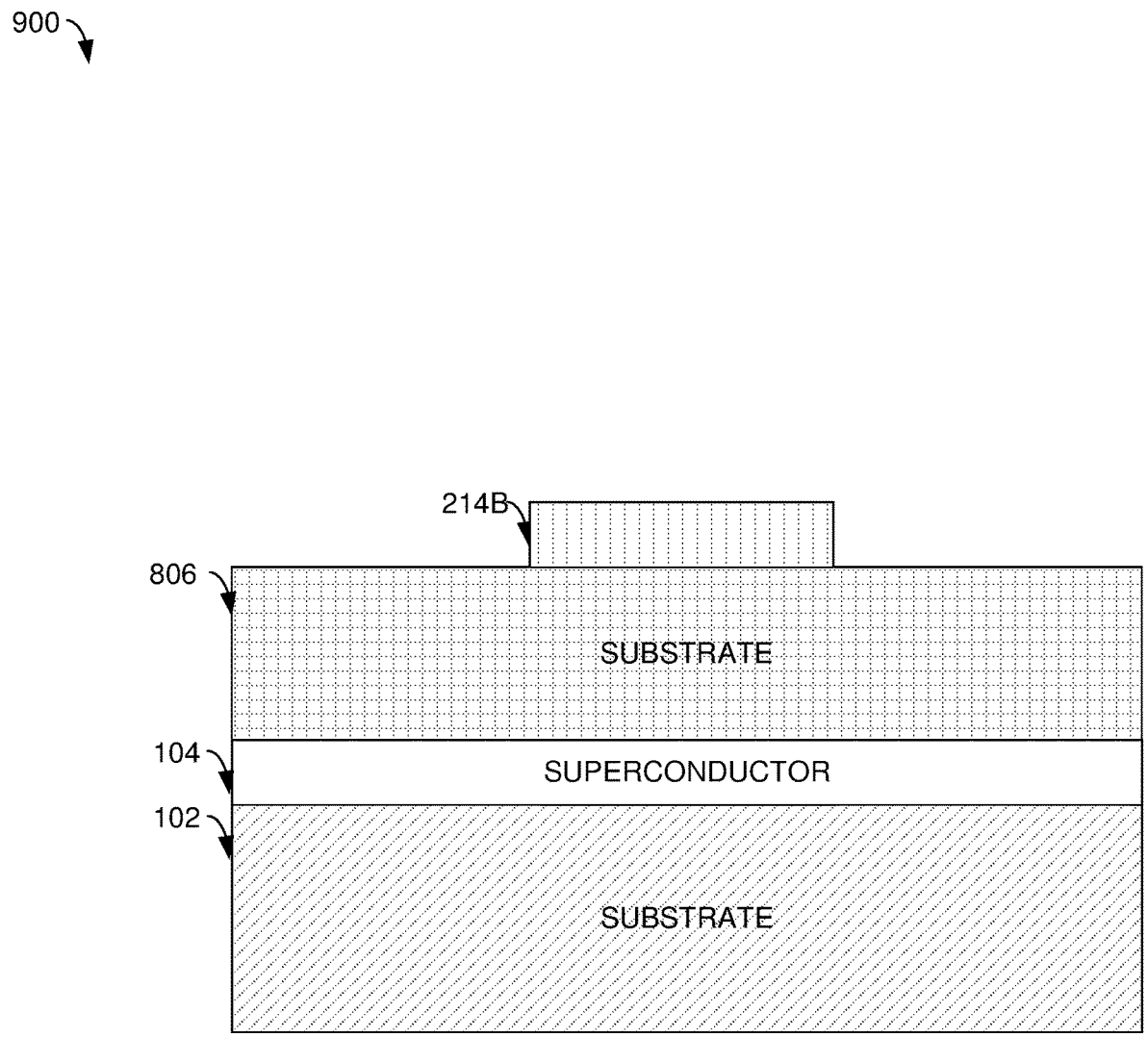
FIG. 9 illustrates a cross-sectional view of a portion of the example, non-limiting chip surface base device structure of FIG. 8 in accordance with one or more embodiments described herein.

FIG. 9 illustrates a cross-sectional view of a portion of the example, non-limiting chip surface base device structure of FIG. 8 in accordance with one or more embodiments described herein. Chip surface base device structure 900 represents a cross-sectional view of chip surface base device structure 800 at the point of dashed line 816. A distance between superconductor 104 and superconductor 214B can be approximately 100 nm (i.e., a height of substrate 806 can be approximately 100 nm).

Figure 10:
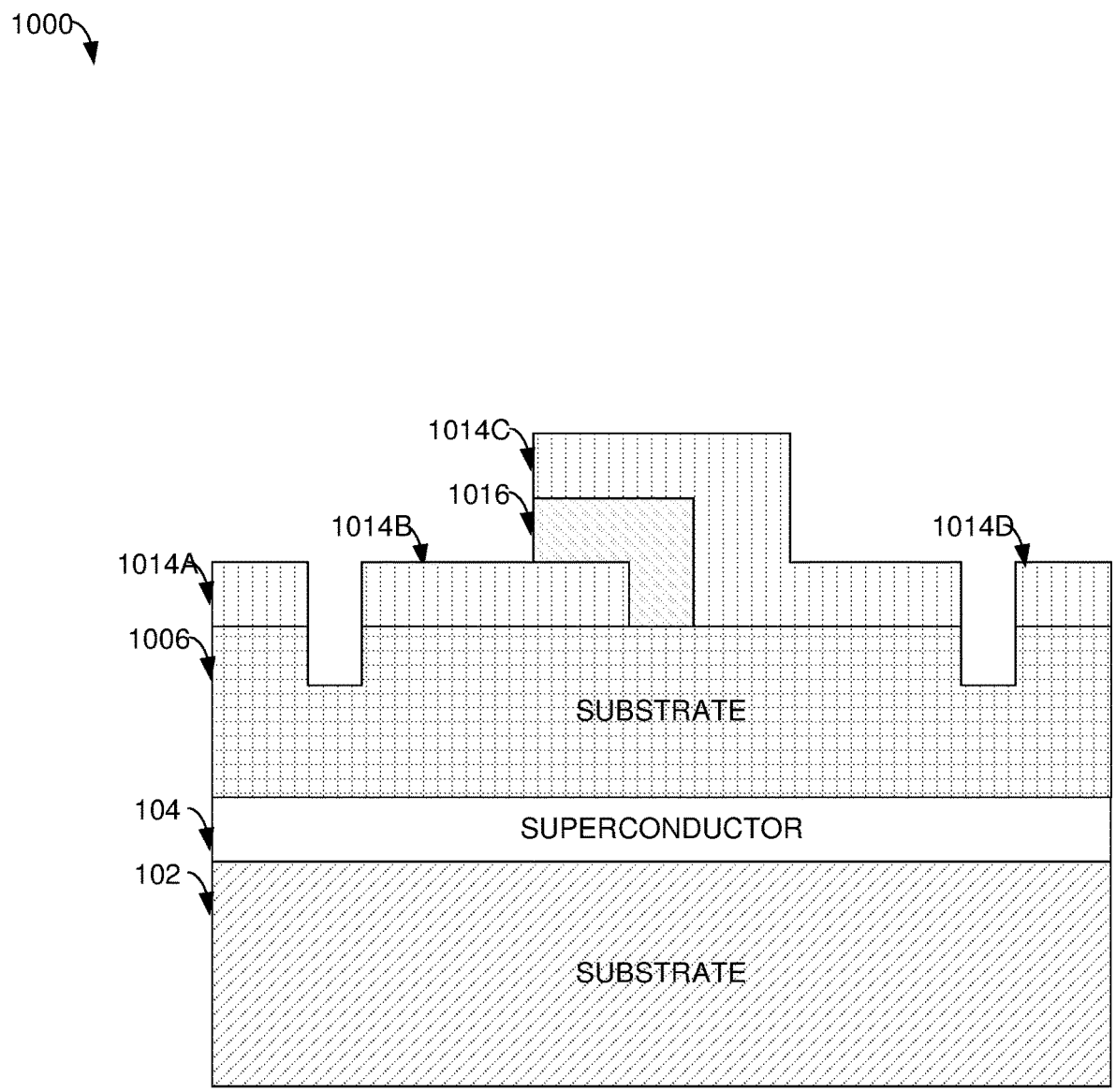
FIG. 10 illustrates another cross-sectional view of a portion of the example, non-limiting chip surface base device structure of FIG. 8 in accordance with one or more embodiments described herein.

FIG. 10 illustrates another cross-sectional view of a portion of the example, non-limiting chip surface base device structure of FIG. 8 in accordance with one or more embodiments described herein. Chip surface base device structure 1000 features a planar Josephson junction, comprising superconductor 1014B, superconductor 1014C, and tunnel barrier 1016. In the course of forming this planar Josephson junction, superconductor 1014A and superconductor 1014D have been deposited, and superconductor 1014A and superconductor 1014D can serve to electrically couple to microstrip waveguides. The shunting capacitor for the transmon qubit (not shown to scale) can be implemented in superconductor 1014B and superconductor 1014C. In some examples, superconductor 1014B and superconductor 1014C can each serve as a superconducting contact on a side of a Josephson junction.

Additionally, in chip surface base device structure 1000, some of a top level of substrate has been removed, shown with substrate 1006. It can be noted that while some of substrate 1006 has been removed, it has not been removed down to the level of superconductor 104 in any place, so superconductor 104 is still fully covered by substrate 1006.

In chip surface base device structure 1000, a qubit is achieved through a planar Josephson junction on top of SOM. Then, external circuitry can utilize microstrip lines, such as those electrically coupled to superconductor 1014B and/or superconductor 1014C. As an example, for a top silicon thickness ($t_{Si}$)~200 nm, the width ($w_{\mu strip}$) of an impedance (Z)~50 Ohm microstrip line is ~100 nm.

Figure 11:
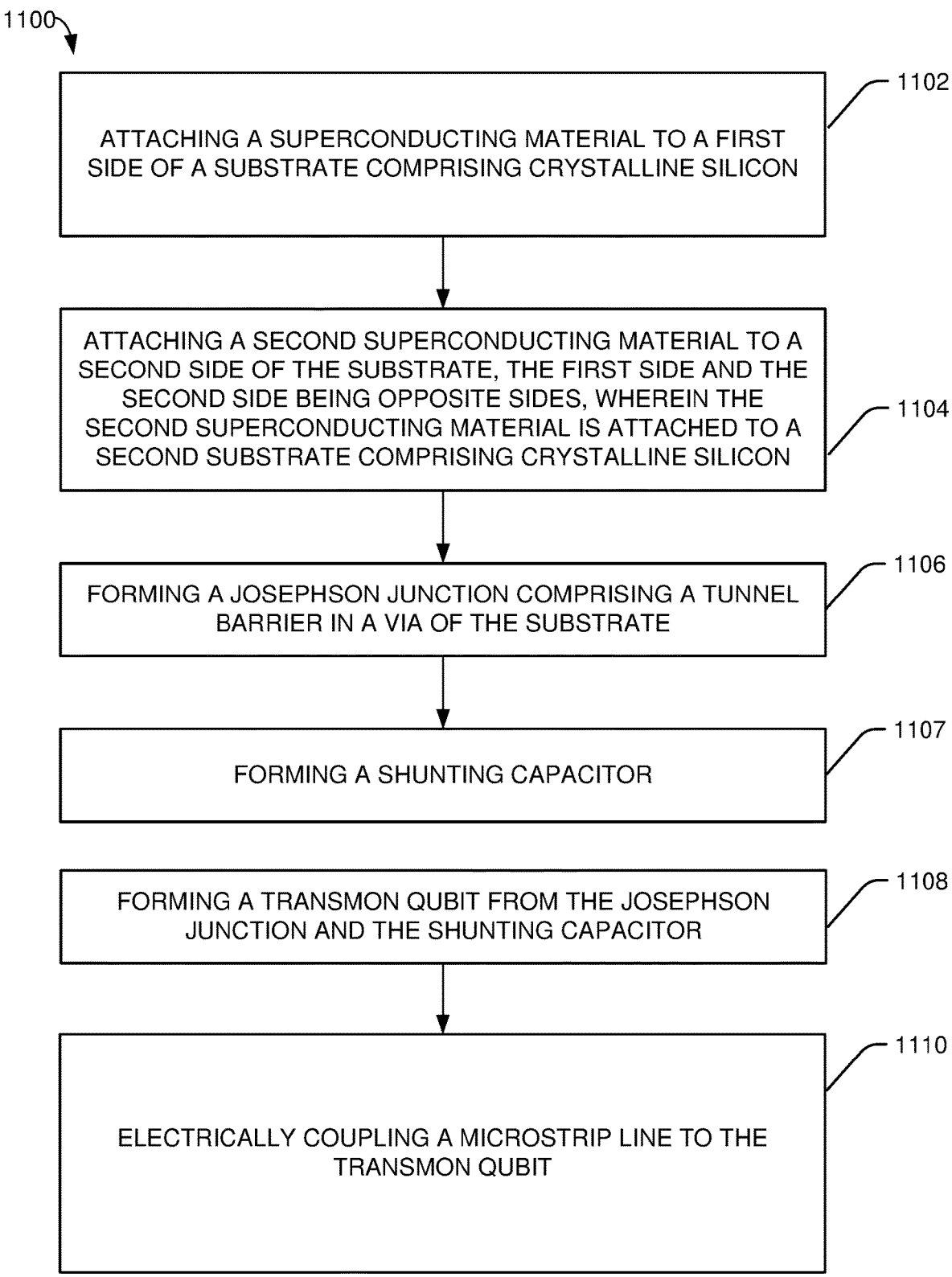
FIG. 11 illustrates a flow diagram of an example, non-limiting computer-implemented method that facilitates implementing a vertical transmon qubit device with microstrip waveguides on a SOM substrate in accordance with one or more embodiments described herein.

FIG. 11 illustrates a flow diagram of an example, non-limiting computer-implemented method that facilitates implementing a vertical transmon qubit device in accordance with one or more embodiments described herein. In some examples, flow diagram 1100 can be implemented by computer 1312. It can be appreciated that the operations of flow diagram 1100 can be implemented in a different order than is depicted. It can also be appreciated that the operations of flow diagram 1100 can be implemented in a different order than is depicted.

In non-limiting example embodiments, a computing device (or system) (e.g., computer 1312) is provided comprising one or more processors and one or more memories that stores executable instructions that, when executed by the one or more processors, can facilitate performance of the operations as described herein, including the non-limiting methods as illustrated in the flow diagrams of FIG. 11. As a non-limiting example, the one or more processors can facilitate performance of the methods by directing or controlling one or more equipment operable to perform semiconductor fabrication.

Such a transmon qubit as one produced by the method depicted in FIG. 11 can have an advantage of providing easier options for electrical coupling, and more options for electrical coupling. In particular, this advantage can be manifested in an ability to capacitively couple such a vertical transmon to top-layer microstrip lines.

Operation 1102 depicts attaching (e.g., by computer 1312) a superconducting material to a first side of a substrate comprising crystalline silicon. Operation 1104 depicts attaching (e.g., by computer 1312) a second superconducting material to a second side of the substrate, the first side and the second side being opposing sides, wherein the second superconducting material is attached to a second substrate comprising crystalline silicon.

In some examples, attaching two materials can comprise physically coupling the two materials to each other, including mechanically or chemically coupling the two materials. In some examples, this physical coupling arrangement can be referred as the various materials being stacked upon each other, and can comprise a SOM base. In some examples, the first substrate comprises crystalline silicon. In some examples, the second substrate comprises crystalline silicon. Crystalline silicon can be used in the course of fabricating a SOM substrate.

Operation 1106 depicts forming (e.g., by computer 1312) a Josephson junction comprising a tunnel barrier in a via of the substrate. Operation 1107 depicts forming (e.g., by computer 1312) a capacitor shunting the Josephson junction. Operation 1108 depicts forming (e.g., by computer 1312) a transmon qubit from the Josephson junction and the shunting capacitor.

In some examples, the transmon qubit is grounded by the second superconducting material (i.e., connected to a ground potential). For example, in chip surface base device structure 200, superconductor 104 can have a ground potential, thus grounding the transmon qubit formed, in part by superconductor 108, tunnel barrier 110, and superconductor 112.

In some examples, the transmon qubit is electrically isolated (i.e., not physically connected) from a portion of the second superconducting material by a defined gap, or a break, in the second superconducting material. For example, in chip surface base device structure 700, while the transmon qubit is attached to superconductor 704B, it is electrically isolated from both superconductor 704A and superconductor 704C, as shown by defined gap 716A (between superconductor 704A and superconductor 704B), and defined gap 716B (between superconductor 704B and superconductor 704C).

In some examples, the second superconducting material comprises a communication line that communicatively (or electrically) couples the transmon qubit with another device. For example, in chip surface base device structure 200, superconductor 104 can serve as a communicative coupling between a transmon qubit of chip surface base device structure 200 and another transmon qubit.

In some examples, the transmon qubit comprises a vertical transmon qubit. An example of this vertical transmon qubit can be found in chip surface base device structure 200.

In some examples, the transmon qubit comprises a planar transmon qubit, comprising a planar overlap Josephson junction and a capacitor. An example of this planar transmon qubit can be found in chip surface base device structure 1000, where a planar overlap Josephson junction is formed by superconductor 1014B, tunnel barrier 1016, and superconductor 1014C.

Operation 1110 depicts electrically coupling (e.g., by computer 1312) a microstrip line to the transmon qubit.

In some examples, the microstrip line is electrically coupled to one or more transmon qubits, and the microstrip line comprises a portion of the superconducting material. That is, a portion of the superconducting material can function as the microstrip line itself.

In some examples, an isolation moat electrically isolates the microstrip line from a second microstrip line or a second transmon qubit. For example, in chip surface base device structure 300, superconductor 104 can have a ground potential. Since superconductor 314D and superconductor 314E (possibly in conjunction with other features) are attached to superconductor 104, they can have the same ground potential as superconductor 104. In this arrangement, superconductor 314D and superconductor 314E can electrically isolate each of superconductor 214B and superconductor 214C, which can each serve as a microstrip line.

A general approach to grounding a ground plane is to expose—somewhere on a chip surface base device structure—the buried metal to physically make a connection with an external control circuit. Thus, using an isolation moat can have an advantage of providing a direct connection to this bottom layer, buried metal. Additionally, providing a moat around chip edges can have an advantage of improving signal integrity because there is more electrical isolation from crosstalk.

A coplanar waveguide can generally comprise a signal line and ground potential around it. Then, a microstrip can generally comprise a signal line on top of a chip surface base device structure with ground potential around it that is far from other features of the chip surface base device structure (or coupled with features). This creates a different impedance, or different microwave modes for a microstrip relative to a coplanar waveguide, and these different characteristics can provide an advantage for an approach that utilizes microstrips.

In some examples, a ground potential source is electrically coupled to the isolation moat, wherein the ground potential source causes the superconducting material to have a ground potential. For example, where the isolation moat (e.g., in chip surface base device structure 600 superconductor 314D and superconductor 314E) is attached to the superconducting material (e.g., superconductor 104), then by electrically coupling a ground potential source to the isolation moat, both the isolation moat and the superconducting material can have a ground potential.

FIG. 12 illustrates a flow diagram of an example, non-limiting computer-implemented method that facilitates implementing a vertical transmon qubit device in accordance with one or more embodiments described herein. In some examples, flow diagram 1200 can be implemented by computer 1312. It can be appreciated that the operations of flow diagram 1200 can be implemented in a different order than is depicted. It can also be appreciated that the operations of flow diagram 1200 can be implemented in a different order than is depicted.

In non-limiting example embodiments, a computing device (or system) (e.g., computer 1312) is provided comprising one or more processors and one or more memories that stores executable instructions that, when executed by the one or more processors, can facilitate performance of the operations as described herein, including the non-limiting methods as illustrated in the flow diagrams of FIG. 12. As a non-limiting example, the one or more processors can facilitate performance of the methods by directing or controlling one or more equipment operable to perform semiconductor fabrication.

Such a transmon qubit as one produced by the method depicted in FIG. 12 can have an advantage of providing easier options for electrical coupling, and more options for electrical coupling. In particular, this advantage can be manifested in an ability to capacitively couple such a vertical transmon to top-layer microstrip lines.

Operation 1202 depicts attaching (e.g., by computer 1312) a substrate comprising crystalline silicon to a superconducting material and a second superconducting material, the first superconducting material and the second superconducting material being attached to opposing sides of the substrate, and a second substrate comprising crystalline silicon attached to the second superconducting material.

In some examples, this physical coupling arrangement can be referred as the various materials being stacked upon each other, and can comprise a SOM base. In some examples, the first substrate comprises crystalline silicon.

Operation 1204 depicts forming (e.g., by computer 1312) a transmon qubit comprising a Josephson junction with at least one superconducting contact on the first side of the substrate and a capacitor shunting the Josephson junction. This superconducting contact can comprise a physical contact between the Josephson junction and a superconducting material that is located on the first side of the substrate.

In some examples, the transmon qubit is grounded by the second superconducting material. For example, in chip surface base device structure 200, superconductor 104 can have a ground potential, thus grounding the transmon qubit formed, in part by superconductor 108, tunnel barrier 110, and superconductor 112.

In some examples, the transmon qubit is electrically isolated from a portion of the second superconducting material by a defined gap, or a break, in the second superconducting material. For example, in chip surface base device structure 700, while the transmon qubit is attached to superconductor 704B, it is electrically isolated from both superconductor 704A and superconductor 704C, as shown by defined gap 716A (between superconductor 704A and superconductor 704B), and defined gap 716B (between superconductor 704B and superconductor 704C).

In some examples, the microstrip line comprises a communication line that communicatively couples the transmon qubit with another device. For example, in chip surface base device structure 200, superconductor 104 can serve as a communicative coupling between a transmon qubit of chip surface base device structure 200 and another transmon qubit.

In some examples, the transmon qubit comprises a vertical transmon qubit. An example of this vertical transmon qubit can be found in chip surface base device structure 200.

In some examples, the transmon qubit comprises a planar transmon qubit. An example of this planar transmon qubit can be found in chip surface base device structure 1000.

Operation 1206 depicts electrically coupling (e.g., by computer 1312) a microstrip line to the transmon qubit.

In some examples, the microstrip line is electrically coupled to the transmon qubit, and the microstrip line comprises a portion of the superconducting material. That is, a portion of the superconducting material can function as the microstrip line itself.

In some examples, an isolation moat electrically isolates the microstrip line from a second microstrip line or a second transmon qubit. For example, in chip surface base device structure 300, superconductor 104 can have a ground potential. Since superconductor 314D and superconductor 314E (possibly in conjunction with other features) are attached to superconductor 104, they can have the same ground potential as superconductor 104. In this arrangement, superconductor 314D and superconductor 314E can electrically isolate each of superconductor 214B and superconductor 214C, which can each serve as a microstrip line.

In some examples, a ground potential source is electrically coupled to the isolation moat, wherein the ground potential source causes the superconducting material to have a ground potential. For example, where the isolation moat (e.g., in chip surface base device structure 600 superconductor 314D and superconductor 314E) is attached to the superconducting material (e.g., superconductor 104), then by electrically coupling a ground potential source to the isolation moat, both the isolation moat and the superconducting material can have a ground potential.

Figure 13:
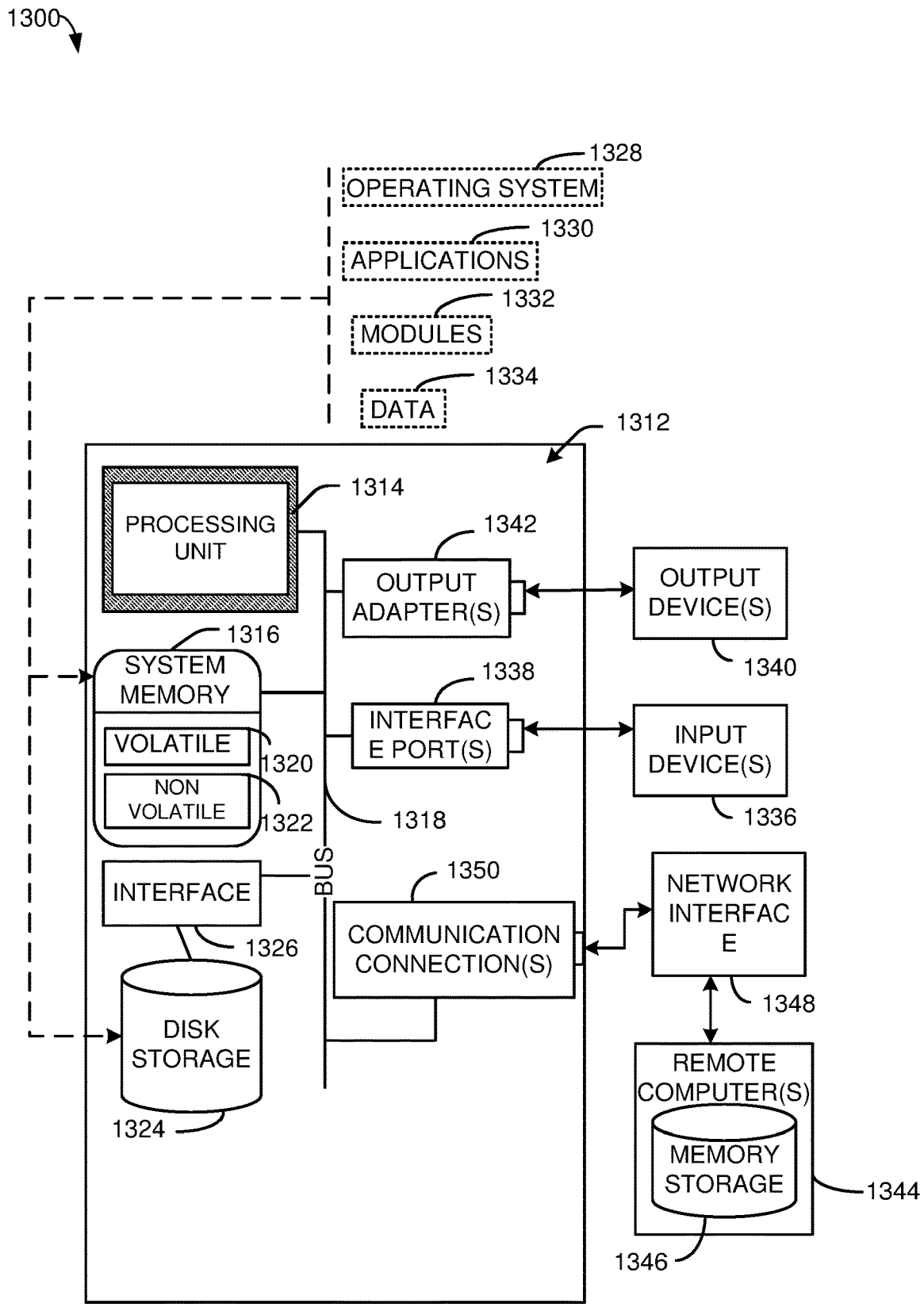
FIG. 13 illustrates a block diagram of an example, non-limiting operating environment in which one or more embodiments described herein can be facilitated.

In order to provide a context for the various aspects of the disclosed subject matter, FIG. 13 as well as the following discussion are intended to provide a general description of a suitable environment in which the various aspects of the disclosed subject matter can be implemented. For example, operating environment 1300 can be used to implement aspects of the example, non-limiting computer-implemented methods that facilitates implementing a vertical Josephson junction superconducting device of FIGS. 12 and 13.

FIG. 13 illustrates a block diagram of an example, non-limiting operating environment in which one or more embodiments described herein can be facilitated. Repetitive description of like elements employed in other embodiments described herein is omitted for sake of brevity. With reference to FIG. 13, a suitable operating environment 1300 for implementing various aspects of this disclosure can also include a computer 1312. The computer 1312 can also include a processing unit 1314, a system memory 1316, and a system bus 1318. The system bus 1318 couples system components including, but not limited to, the system memory 1316 to the processing unit 1314. The processing unit 1314 can be any of various available processors. Dual microprocessors and other multiprocessor architectures also can be employed as the processing unit 1314. The system bus 1318 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Firewire (IEEE 1394), and Small Computer Systems Interface (SCSI).

The system memory 1316 can also include volatile memory 1320 and nonvolatile memory 1322. The basic input/output system (BIOS), containing the basic routines to transfer information between elements within the computer 1312, such as during start-up, is stored in nonvolatile memory 1322. By way of illustration, and not limitation, nonvolatile memory 1322 can include read only memory (ROM), programmable ROM (PROM), electrically programmable ROM (EPROM), electrically erasable programmable ROM (EEPROM), flash memory, or nonvolatile random access memory (RAM) (e.g., ferroelectric RAM (FeRAM). Volatile memory 1320 can also include random access memory (RAM), which acts as external cache memory. By way of illustration and not limitation, RAM is available in many forms such as static RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM), and Rambus dynamic RAM.

Computer 1312 can also include removable/non-removable, volatile/non-volatile computer storage media. FIG. 13 illustrates, for example, a disk storage 1324. Disk storage 1324 can also include, but is not limited to, devices like a magnetic disk drive, floppy disk drive, tape drive, Jaz drive, Zip drive, LS-100 drive, flash memory card, or memory stick. The disk storage 1324 also can include storage media separately or in combination with other storage media including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage 1324 to the system bus 1318, a removable or non-removable interface is typically used, such as interface 1326. FIG. 13 also depicts software that acts as an intermediary between users and the basic computer resources described in the suitable operating environment 1300. Such software can also include, for example, an operating system 1328. Operating system 1328, which can be stored on disk storage 1324, acts to control and allocate resources of the computer 1312.

System applications 1330 take advantage of the management of resources by operating system 1328 through program modules 1332 and program data 1334, e.g., stored either in system memory 1316 or on disk storage 1324. It is to be appreciated that this disclosure can be implemented with various operating systems or combinations of operating systems. A user enters commands or information into the computer 1312 through input device(s) 1336. Input devices 1336 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 1314 through the system bus 1318 via interface port(s) 1338. Interface port(s) 1338 include, for example, a serial port, a parallel port, a game port, and a universal serial bus (USB). Output device(s) 1340 use some of the same type of ports as input device(s) 1336. Thus, for example, a USB port can be used to provide input to computer 1312, and to output information from computer 1312 to an output device 1340. Output adapter 1342 is provided to illustrate that there are some output devices 1340 like monitors, speakers, and printers, among other output devices 1340, which require special adapters. The output adapters 1342 include, by way of illustration and not limitation, video and sound cards that provide a means of connection between the output device 1340 and the system bus 1318. It should be noted that other devices and/or systems of devices provide both input and output capabilities such as remote computer(s) 1344.

Computer 1312 can operate in a networked environment using logical connections to one or more remote computers, such as remote computer(s) 1344. The remote computer(s) 1344 can be a computer, a server, a router, a network PC, a workstation, a microprocessor based appliance, a peer device or other common network node and the like, and typically can also include many or all of the elements described relative to computer 1312. For purposes of brevity, only a memory storage device 1346 is illustrated with remote computer(s) 1344. Remote computer(s) 1344 is logically connected to computer 1312 through a network interface 1348 and then physically connected via communication connection 1350. Network interface 1348 encompasses wire and/or wireless communication networks such as local-area networks (LAN), wide-area networks (WAN), cellular networks, etc. LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL). Communication connection(s) 1350 refers to the hardware/software employed to connect the network interface 1348 to the system bus 1318. While communication connection 1350 is shown for illustrative clarity inside computer 1312, it can also be external to computer 1312. The hardware/software for connection to the network interface 1348 can also include, for exemplary purposes only, internal and external technologies such as, modems including regular telephone grade modems, cable modems and DSL modems, ISDN adapters, and Ethernet cards.

The present invention can be a system, a method, an apparatus and/or a computer program product at any possible technical detail level of integration. The computer program product can include a computer readable storage medium (or media) having computer readable program instructions thereon for causing a processor to carry out aspects of the present invention. The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium can also include the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network can comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device. Computer readable program instructions for carrying out operations of the present invention can be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions can execute entirely on the user's computer, partly on the user's computer, as a stand-alone software package, partly on the user's computer and partly on a remote computer or entirely on the remote computer or server. In the latter scenario, the remote computer can be connected to the user's computer through any type of network, including a local area network (LAN) or a wide area network (WAN), or the connection can be made to an external computer (for example, through the Internet using an Internet Service Provider). In some embodiments, electronic circuitry including, for example, programmable logic circuitry, field-programmable gate arrays (FPGA), or programmable logic arrays (PLA) can execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions. These computer readable program instructions can be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions can also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks. The computer readable program instructions can also be loaded onto a computer, other programmable data processing apparatus, or other device to cause a series of operational acts to be performed on the computer, other programmable apparatus or other device to produce a computer-implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams can represent a module, segment, or portion of instructions, which comprises one or more executable instructions for implementing the specified logical function(s). In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the subject matter has been described above in the general context of computer-executable instructions of a computer program product that runs on a computer and/or computers, those skilled in the art will recognize that this disclosure also can or can be implemented in combination with other program modules. Generally, program modules include routines, programs, components, data structures, etc. that perform particular tasks and/or implement particular abstract data types. Moreover, those skilled in the art will appreciate that the inventive computer-implemented methods can be practiced with other computer system configurations, including single-processor or multiprocessor computer systems, mini-computing devices, mainframe computers, as well as computers, hand-held computing devices (e.g., PDA, phone), microprocessor-based or programmable consumer or industrial electronics, and the like. The illustrated aspects can also be practiced in distributed computing environments in which tasks are performed by remote processing devices that are linked through a communications network. However, some, if not all aspects of this disclosure can be practiced on stand-alone computers. In a distributed computing environment, program modules can be located in both local and remote memory storage devices.

As used in this application, the terms "component," "system," "platform," "interface," and the like, can refer to and/or can include a computer-related entity or an entity related to an operational machine with one or more specific functionalities. The entities disclosed herein can be either hardware, a combination of hardware and software, software, or software in execution. For example, a component can be, but is not limited to being, a process running on a processor, a processor, an object, an executable, a thread of execution, a program, and/or a computer. By way of illustration, both an application running on a server and the server can be a component. One or more components can reside within a process and/or thread of execution and a component can be localized on one computer and/or distributed between two or more computers. In another example, respective components can execute from various computer readable media having various data structures stored thereon. The components can communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry, which is operated by a software or firmware application executed by a processor. In such a case, the processor can be internal or external to the apparatus and can execute at least a part of the software or firmware application. As yet another example, a component can be an apparatus that provides specific functionality through electronic components without mechanical parts, wherein the electronic components can include a processor or other means to execute software or firmware that confers at least in part the functionality of the electronic components. In an aspect, a component can emulate an electronic component via a virtual machine, e.g., within a cloud computing system.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. As used herein, the terms "example" and/or "exemplary" are utilized to mean serving as an example, instance, or illustration. For the avoidance of doubt, the subject matter disclosed herein is not limited by such examples. In addition, any aspect or design described herein as an "example" and/or "exemplary" is not necessarily to be construed as preferred or advantageous over other aspects or designs, nor is it meant to preclude equivalent exemplary structures and techniques known to those of ordinary skill in the art.

As it is employed in the subject specification, the term "processor" can refer to substantially any computing processing unit or device comprising, but not limited to, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, or any combination thereof designed to perform the functions described herein. Further, processors can exploit nano-scale architectures such as, but not limited to, molecular and quantum-dot based transistors, switches and gates, in order to optimize space usage or enhance performance of user equipment. A processor can also be implemented as a combination of computing processing units. In this disclosure, terms such as "store," "storage," "data store," data storage," "database," and substantially any other information storage component relevant to operation and functionality of a component are utilized to refer to "memory components," entities embodied in a "memory," or components comprising a memory. It is to be appreciated that memory and/or memory components described herein can be either volatile memory or nonvolatile memory, or can include both volatile and nonvolatile memory. By way of illustration, and not limitation, nonvolatile memory can include read only memory (ROM), programmable ROM (PROM), electrically programmable ROM (EPROM), electrically erasable ROM (EEPROM), flash memory, or nonvolatile random access memory (RAM) (e.g., ferroelectric RAM (FeRAM). Volatile memory can include RAM, which can act as external cache memory, for example. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM), and Rambus dynamic RAM (RDRAM). Additionally, the disclosed memory components of systems or computer-implemented methods herein are intended to include, without being limited to including, these and any other suitable types of memory.

What has been described above include mere examples of systems and computer-implemented methods. It is, of course, not possible to describe every conceivable combination of components or computer-implemented methods for purposes of describing this disclosure, but one of ordinary skill in the art can recognize that many further combinations and permutations of this disclosure are possible. Furthermore, to the extent that the terms "includes," "has,"

"possesses," and the like are used in the detailed description, claims, appendices and drawings such terms are intended to be inclusive in a manner similar to the term "comprising" as "comprising" is interpreted when employed as a transitional word in a claim.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method, comprising:
   attaching a superconducting material to a first side of a substrate comprising crystalline silicon;
   attaching a second superconducting material to a second side of the substrate, the first side and the second side being opposing sides, wherein the second superconducting material is attached to a second substrate comprising crystalline silicon;
   forming a Josephson junction with at least one superconducting contact on the first side of the substrate;
   forming a transmon qubit from the Josephson junction and a capacitor; and
   electrically coupling a microstrip line to the transmon qubit.

2. The method of claim 1, wherein the microstrip line is electrically coupled to one or more transmon qubits.

3. The method of claim 1, wherein the microstrip line comprises a portion of the superconducting material.

4. The method of claim 1, further comprising:
   forming a component that electrically isolates the microstrip line from a second microstrip line.

5. The method of claim 1, further comprising:
   forming a component that electrically isolates the microstrip line from a second transmon qubit.

6. The method of claim 4, further comprising:
   electrically coupling a ground potential source to the component and thereby causing the second superconducting material to have a ground potential.

7. The method of claim 1, wherein the forming the transmon qubit comprises forming a vertical transmon qubit.

8. The method of claim 1, wherein the forming the transmon qubit comprises forming a planar transmon qubit.

9. A method, comprising:
   attaching a substrate comprising crystalline silicon to a superconducting material and a second superconducting material, the superconducting material and the second superconducting material being attached to opposing sides of the substrate, and a second substrate comprising crystalline silicon attached to the second superconducting material;
   forming a transmon qubit comprising a Josephson junction with at least one superconducting contact on the first side of the substrate; and
   electrically coupling a microstrip line to the transmon qubit.

10. The method of claim 9, wherein the microstrip line is electrically coupled to one or more transmon qubits.

11. The method of claim 9, wherein the microstrip line comprises a portion of the superconducting material.

12. The method of claim 9, wherein the forming the transmon qubit comprises forming a vertical transmon qubit with the Josephson junction in a via of the substrate.

13. The method of claim 9, wherein the forming the transmon qubit comprises forming a planar transmon qubit.

14. The method of claim 13, wherein the planar transmom qubit comprises a planar overlap Josephson junction and a capacitor.

15. A method, comprising:
   connecting a superconducting material to a first side of a substrate comprising crystalline silicon;
   providing a second superconducting material on a second side of the substrate and stacked on a second substrate comprising crystalline silicon, wherein the first side of the substrate and the second side of the substrate are opposite sides;
   providing a transmon qubit between the superconducting material and the second superconducting material, the transmom qubit comprising:
      a capacitor; and
      a Josephson junction in parallel with the capacitor, wherein the Josephson junction is formed in a via of the substrate and comprising a tunnel barrier;
   forming a microstrip line based on a portion of the superconducting material; and
   electrically coupling the microstrip line to the transmon qubit.

16. The method of claim 15, wherein the substrate, the second superconducting material, and the second substrate comprise a silicon-on-metal (SOM) base.

17. The method of claim 16, wherein the SOM base is a superconducting metal.

18. The method of claim 15, wherein the capacitor comprises a shunt capacitor.

* * * * *